(12) United States Patent
Akcakaya et al.

(10) Patent No.: US 10,330,760 B2
(45) Date of Patent: Jun. 25, 2019

(54) SYSTEM AND METHOD FOR ASSESSING $T_2$-RELAXATION TIMES WITH IMPROVED ACCURACY

(71) Applicant: BETH ISRAEL DEACONESS MEDICAL CENTER, INC., Boston, MA (US)

(72) Inventors: Mehmet Akcakaya, Boston, MA (US); Tamer Basha, Revere, MA (US); Warren J. Manning, Natick, MA (US); Reza Nezafat, Waban, MA (US)

(73) Assignee: BETH ISRAEL DEACONESS MEDICAL CENTER, INC., Bethesda, MD (US)

( * ) Notice: Subject to any disclaimer, the term of this patent is extended or adjusted under 35 U.S.C. 154(b) by 1132 days.

(21) Appl. No.: 14/663,994

(22) Filed: Mar. 20, 2015

(65) Prior Publication Data
US 2015/0268320 A1    Sep. 24, 2015

Related U.S. Application Data

(60) Provisional application No. 61/968,883, filed on Mar. 21, 2014.

(51) Int. Cl.
*G01R 33/50* (2006.01)
*G01R 33/567* (2006.01)

(52) U.S. Cl.
CPC .......... *G01R 33/50* (2013.01); *G01R 33/5673* (2013.01); *G01R 33/5676* (2013.01)

(58) Field of Classification Search
CPC ........................... G01R 33/50; G01R 33/5673; G01R 33/5676; G01R 33/5608; G01R 33/5611; G01R 33/4835

(Continued)

(56) References Cited

U.S. PATENT DOCUMENTS 8,148,979 B1* 4/2012 Du ..................... G01R 33/4816
324/307
8,457,711 B2 6/2013 Nezafat et al.
(Continued)

FOREIGN PATENT DOCUMENTS

| JP | 2006-501919 A | 1/2006 |
| KR | 2001-0090734 A | 10/2001 |
| KR | 10-2012-0120899 A | 11/2012 |

OTHER PUBLICATIONS

Feliciano, Hélène, Matthias Stuber, and Ruud B. van Heeswijk. "Radial cardiac T 2 mapping with alternating T 2 preparation intrinsically introduces motion correction." Journal of Cardiovascular Magnetic Resonance 16.1 (2014): p. 28.*

(Continued)

*Primary Examiner* — Christopher P McAndrew
(74) *Attorney, Agent, or Firm* — Sughrue Mion, PLLC

(57) ABSTRACT

An MRI apparatus includes: a data processor configured to acquire a first set of $T_2$-weighted imaging data and a second set of $T_2$-weighted imaging data; a pulse sequence controller configured to generate a pulse sequence and apply the generated pulse sequence to a gradient coil assembly and RF coil assembly, the generated pulse sequence including: $T_2$-preparation modules and associated imaging modules to acquire the first set of $T_2$-weighted imaging data, and a saturation pulse sequence and an associated saturation imaging module to acquire the second set of $T_2$-weighted imaging data; a curve fitter configured to apply the first and second sets of $T_2$-weighted imaging data to a three-parameter model for $T_2$ decay, to determine a $T_2$ value at a plurality of locations; and an image processor configured to generate a $T_2$ map of the object based on the $T_2$ value determined at the plurality of locations.

21 Claims, 8 Drawing Sheets

(58) Field of Classification Search
USPC .......................................................... 324/309
See application file for complete search history.

(56) References Cited

U.S. PATENT DOCUMENTS

| | | | |
|---|---|---|---|
| 8,581,583 B2 | 11/2013 | Greiser | |
| 2003/0216638 A1* | 11/2003 | Dharmakumar ... | A61K 49/1881 600/420 |
| 2005/0065430 A1* | 3/2005 | Wiethoff ............... | A61K 49/085 600/413 |
| 2006/0164087 A1* | 7/2006 | Smink ................ | G01R 33/5676 324/309 |
| 2006/0253015 A1* | 11/2006 | Nezafat .............. | G01R 33/5635 600/410 |
| 2008/0004518 A1 | 1/2008 | Stehning et al. | |
| 2008/0221429 A1* | 9/2008 | Nezafat .............. | G01R 33/5635 600/410 |
| 2012/0194186 A1* | 8/2012 | Rehwald ................ | G01R 33/50 324/309 |
| 2013/0088227 A1* | 4/2013 | Wernik ................ | A61B 5/0263 324/309 |
| 2013/0278258 A1* | 10/2013 | Smith .................... | G01R 33/56 324/309 |
| 2013/0285655 A1* | 10/2013 | Miyazaki ............. | G01R 33/543 324/309 |

OTHER PUBLICATIONS

Feliciano, Helene, Matthias Stuber, and Ruud B. van Heeswijk. "Radial cardiac T 2 mapping with alternating T 2 preparation intrinsically introduces motion correction." Journal of Cardiovascular Magnetic Resonance 16.1 (2014): p. 28. (Year: 2014).*

Communication dated Jul. 1, 2016 issued by the Korean Intellectual Property Office in counterpart Korean Patent Application No. 10-2015-0040088.

Helene Feliciano et al., "Radial cardiac $T_2$ mapping with alternating $T_2$ preparation intrinsically introduces motion correction", Journal of Cardiovascular Magnetic Resonance, 16(Suppl 1): p. 28, (2014), (2 Pages Total).

Bent O. Kjos et al., "Reproducibility of T1 and T2 Relaxation Times Calculated from Routine MR Imaging Sequences: Phantom Study", AJNR: 6:, Mar./Apr. 1985 (pp. 277-283).

International Search Report, issued by International Searching Authority in corresponding International Application No. PCT/US2015/058005, dated Jan. 19, 2016. (PCT/ISA/210).

Written Opinion, issued by International Searching Authority in corresponding International Application No. PCT/US2015/058005, dated Jan. 19, 2016. (PCT/ISA/237).

Kellman, et al., "$T_2$-Prepared SSFP Improves Diagnostic Confidence in Edema Imaging in Acute Myocardial Infarction Compared to Turbo Spin Echo", Magnetic Resonance in Medicine 57, pp. 891-897 (2007).

Huang, et al., "$T_2$ Measurement of the Human Myocardium Using a $T_2$-Prepared Transient-State TrueFISP Sequence", Magnetic Resonance in Medicine 57, pp. 960-966 (2007).

Verhaert, et al., "Direct T2 Quantification of Myocardial Edema in Acute Ischemic Injury", JACC: Cardiovascular Imaging, vol. 4, No. 3, Mar. 2011, pp. 269-278.

Giri et al., "T2 quantification for improved detection of myocardial edema", Journal of Cardiovascular Magnetic Resonance, Published: Dec. 30, 2009, total 13 pages.

Giri et al., "Myocardial $T_2$ Mapping with Respiratory Navigator and Automatic Nonrigid Motion Correction", Magnetic Resonance in Medicine 68, pp. 1570-1578 (2012), Published online Jan. 3, 2012.

Van Heeswijk, et al., "Free-Breathing 3 T Magnetic Resonance $T_2$-Mapping of the Heart", JACC: Cardiovascular Imaging, vol. 5, No. 12, Dec. 2012, pp. 1231-1239.

Akcakaya, et al., "Improved Quantitative Myocardial $T_2$ Mapping: Impact of the Fitting Model", Magnetic Resonance in Medicine (2014), pp. 1-13.

Giri, et al., "T2 mapping using T2prepared-SSFP: Optimizing echo time, flip angle and parameter fitting", 2012, total 1 page.

Ding, et al., "Three-Dimensional Whole-Heart $T_2$ Mapping at 3T", Magnetic Resonance in Medicine, 2014, total 14 pages.

Van Heeswijk, et al., "Self-Navigated Isotropic Three-Dimensional Cardiac $T_2$ Mapping", Magnetic Resonance in Medicine, 2014, total 6 pages.

\* cited by examiner

FIG. 5

|  |  | Vial #1 (ms) | Vial #2 (ms) | Vial #3 (ms) | Vial #4 (ms) |
|---|---|---|---|---|---|
|  | SE (Reference) | 44.9 | 47.2 | 59.1 | 65.7 |
| 3-point fit | SSFP (linear) | 47.6 ± 4.2 | 50.9 ± 4.0 | 61.8 ± 2.8 | 68.1 ± 6.9 |
|  | GRE (centric) | 45.3 ± 2.7 | 45.5 ± 2.7 | 57.0 ± 2.4 | 61.5 ± 4.7 |
|  | GRE (linear) | 46.8 ± 3.8 | 49.4 ± 3.8 | 59.1 ± 3.3 | 65.5 ± 7.1 |
| 2-point fit | SSFP (linear) | 73.0 ± 1.6 | 64.1 ± 1.7 | 76.0 ± 0.8 | 84.8 ± 1.6 |
|  | GRE (centric) | 47.3 ± 0.8 | 47.5 ± 1.3 | 58.8 ± 0.7 | 67.5 ± 1.3 |
|  | GRE (linear) | 65.4 ± 1.8 | 60.3 ± 1.2 | 72.0 ± 1.0 | 80.6 ± 1.8 |

SYSTEM AND METHOD FOR ASSESSING T$_2$-RELAXATION TIMES WITH IMPROVED ACCURACY

CROSS-REFERENCE TO RELATED APPLICATION

This application claims the benefit of U.S. Provisional Application No. 61/968,883, filed Mar. 21, 2014, the disclosure of which is incorporated herein in its entirety by reference.

STATEMENT REGARDING FEDERALLY SPONSORED RESEARCH

This invention was made with government support under R01EB008743-01A2 and K99HL111410-01 awarded by the National Institutes of Health. The government has certain rights in the invention.

BACKGROUND

1. Field

Apparatuses and methods consistent with exemplary embodiments relate to magnetic resonance imaging (MRI), and, more particularly, to acquiring T$_2$-weighted imaging data.

2. Description of the Related Art

When a substance such as human tissue is subjected to a uniform magnetic field, i.e., a static magnetic field B$_0$, the individual magnetic moments of the excited nuclei in the tissue attempt to align with the static magnetic field B$_0$, but precess about it in random order at their characteristic Larmor frequency. If the substance is subjected to a magnetic excitation field B$_1$ that is in the x-y plane and that is near the Larmor frequency, the net magnetization aligned moment M$_z$ may be rotated, i.e., tipped, into the x-y plane to generate a net transverse magnetic moment M$_t$. An MR signal is emitted by the excited nuclei, i.e., spins, after the excitation magnetic field B$_1$ is terminated, and the MR signal may be received and processed to form an image.

In MRI systems, the excited spins induce an oscillating sine wave signal in a receiving coil. The frequency of this signal is near the Larmor frequency, and its initial amplitude is determined by the magnitude of the transverse magnetic moment M$_t$. The amplitude of the emitted MR signal decays exponentially with time.

The amplitude of the MR signal is dependent on the spin-lattice relaxation process that is characterized by the time constant T$_1$, i.e., a spin-lattice relaxation time. It describes the recovery of the net magnetic moment M to its equilibrium value along the axis of magnetic polarization, i.e., z-magnetization. The difference in T$_1$ values between tissues can be exploited to provide image contrast.

The T$_2$ time constant is referred to as the spin-spin relaxation constant, or the transverse relaxation constant, and is characterized by a spin-spin relaxation time characterizing the signal decay. The T$_2$ constant is inversely proportional to the exponential rate at which the aligned precession of the spins would dephase after removal of the excitation magnetic field B$_1$ in a perfectly homogeneous magnetic field. The T$_1$ time constant is much longer than T$_2$ in most tissues of medical interest.

The biological tissues have different T$_2$ values and this property may be exploited to enhance the contrast between the tissues. Accordingly, T$_2$ serves as an informative MRI parameter, providing non-invasive measurements of tissue status and disease prognosis with respect to a wide range of applications and diseases, including discriminating between acute and chronic myocardial infarction. For example, quantitative T$_2$ mapping may allow assessment of edema with less variability than T$_2$-weighted imaging.

In order to quantify T$_2$, multiple T$_2$-weighted images may be acquired and fitted based on respective echo time (TE) lengths, assuming long repetition time (TR) for complete relaxation. In particular, related art T$_2$ mapping methods acquire three images with different T$_2$-weightings, for example, with T$_2$ magnetization preparation time of 0 ms, 25 ms, and 55 ms. This data is then fit to a two-parameter model, to generate T$_2$ maps. However, imperfection in RF pulses of a T$_2$ magnetization preparation and application of additional RF pulses during imaging are not accounted for in the two-parameter model of the data fit process. Thus, the estimated T$_2$ times may be inaccurate or not readily reproducible. That is, the two-parameter curve-fitting may mismatch the underlying image acquisition.

Accordingly, apparatuses and methods are needed to provide accurate T$_2$ maps without extensive and/or impractical imaging sequences.

SUMMARY

Exemplary embodiments address at least the above problems and/or disadvantages and other disadvantages not described above. Also, the exemplary embodiments are not required to overcome the disadvantages described above, and may not overcome any of the problems described above.

One or more exemplary embodiments provide apparatuses and methods for providing accurate quantifying of T$_2$ values.

One or more exemplary embodiments may provide a three-parameter model that may be used for curve fitting and to generate T$_2$ maps.

One or more exemplary embodiments may provide a pulse sequence to perform imaging after a saturation pulse, which simulates image acquisition for a time equal to infinity.

In accordance with an aspect of an exemplary embodiment, an MRI system includes a data processor configured to acquire a first set of T$_2$-weighted imaging data and a second set of T$_2$-weighted imaging data, from an object disposed in an imaging region; a pulse sequence controller configured to generate a pulse sequence and apply the generated pulse sequence to a gradient coil assembly and RF coil assembly, the generated pulse sequence including: T$_2$-preparation modules including T$_2$-preparation pulses and associated imaging modules including imaging pulses, to acquire the first set of T$_2$-weighted imaging data, and a saturation pulse sequence and an associated saturation imaging module including imaging pulses to acquire the second set of T$_2$-weighted imaging data; a curve fitter configured to apply the first set of T$_2$-weighted imaging data and the second set of T$_2$-weighted imaging data to a three-parameter model for T$_2$ decay that models an image signal relative to a base intensity parameter, a tissue T$_2$ value, and an offset parameter to determine a T$_2$ value at a plurality of locations; and an image processor configured to generate a T$_2$ map of the object based on the T$_2$ value determined at the plurality of locations.

In accordance with an aspect of an exemplary embodiment, an MRI method includes: (a) applying a T$_2$-preparation module including T$_2$-preparation pulses to a region of interest (ROI) of an object; (b) subsequent to an application of the T$_2$-preparation module, applying an associated imaging module including imaging pulses, to acquire a first $T_2$-weighted data from the ROI; (c) repeating applications of the $T_2$-preparation module followed by the associated imaging module a plurality of times to acquire a number of sampling points on a $T_2$-decay curve; (d) applying a saturation pulse sequence to the ROI after a last iteration of the steps (a), (b), and (c); (e) applying a saturation imaging module including imaging pulses following the saturation pulse sequence, to acquire a second $T_2$-weighted data from the ROI with a substantially complete $T_2$ decay; and (f) generating a $T_2$ map of the ROI based on the first $T_2$-weighted data acquired as a result of iterations of steps (a) and (b) and on the second $T_2$-weighted data acquired in step (e) using a $T_2$-relaxation model that includes more than two parameters.

In accordance with an aspect of an exemplary embodiment, a non-transitory computer-readable storage medium having recorded thereon computer instructions that, when executed by a processor, cause the processor to execute a method including: assessing $T_2$-weighted imaging data acquired from an object at a plurality of times to include data at a number of sampling points on a $T_2$-decay curve; processing the $T_2$-weighted imaging data using a three-parameter model for $T_2$ decay; and using the processed $T_2$-weighted imaging data to generate a $T_2$ map of the object.

BRIEF DESCRIPTION OF THE DRAWINGS

The above and/or other aspects will become more apparent by describing certain exemplary embodiments with reference to the accompanying drawings, in which:

FIG. 5 is a table of $T_2$ measurements based on phantom imaging;

DETAILED DESCRIPTION

Figure 1:
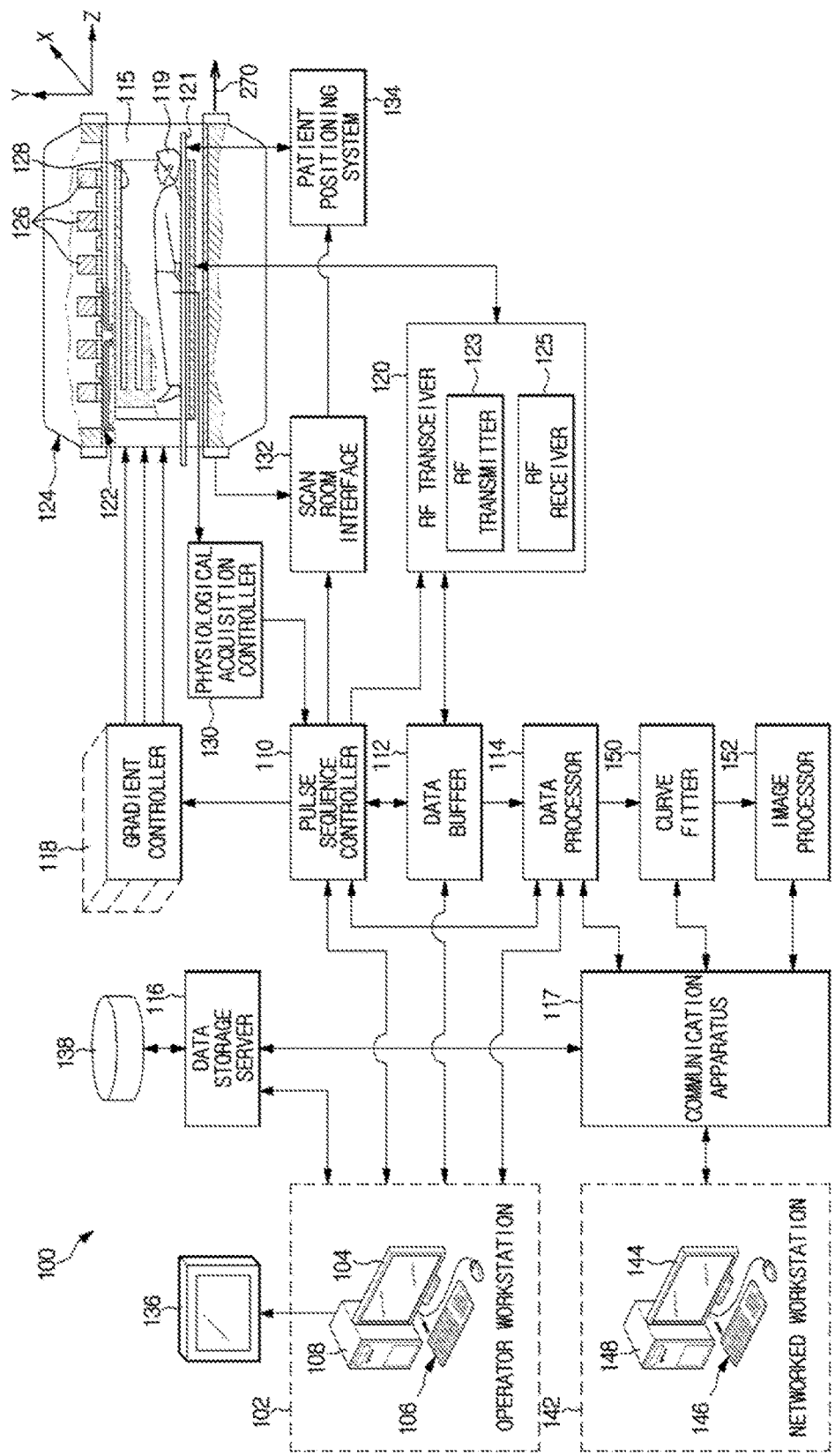
FIG. 1 is a block diagram of an MRI apparatus, according to an exemplary embodiment.

Certain exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions are not described in detail since they would obscure the description with unnecessary detail.

Referring to FIG. 1, an example of an MRI apparatus 100 is illustrated. The MRI apparatus 100 includes a magnet assembly 124, an operator workstation 102, including a display 104, one or more input devices 106, such as a keyboard, mouse, microphone, joystick, etc., and a processor 108. The operator workstation 102 provides the operator interface that enables scan orders to be entered into the MRI apparatus 100. For example, the operator workstation 102 may be coupled to at least one of a pulse sequence controller 110, a data buffer 112, a data processor 114, a data storage server 116, a curve fitter 150, and an image processor 152, which may be interconnected with one another via a communication apparatus 117, which may include any suitable network interface, to provide a connection wirelessly and/or by wire. As an example, the communication apparatus 117 may include a proprietary network, a dedicated network, and/or an open network, such as the Internet.

The magnet assembly 124 includes a main magnet 126, a gradient coil assembly 122, and an RF coil assembly 128 which are sequentially arranged in that order from outermost side to the bore 115. The object 119 is located on the cradle 121 which is moved to the bore 115 of the magnet system 124, such that a magnetic field may be applied to the object 119. The main magnet 126 may be an open magnet.

The main magnet 126 generates a static magnetic field $B_0$ in the bore 115 of the magnet system 124. A direction of the static magnetic field $B_0$ may be parallel or perpendicular to a body axis 270 of the object 119, i.e., to a longitudinal direction of the object 119.

The pulse sequence controller 110 functions in response to instructions received from the operator workstation 102 to operate a gradient controller 118 and an RF transceiver 120.

Gradient waveforms to perform the prescribed scan are generated and applied to the gradient controller 118. The gradient controller 118 is connected with gradient coils of a gradient coil assembly 122, and outputs signal pulses to form the magnetic field gradients. The gradient controller 118 may include driving circuits corresponding to X, Y, and Z gradient coils of the gradient coil assembly 122 that respectively generate the magnetic field gradients in X-axis, Y-axis, and Z-axis directions that are orthogonal to each other and are used for position encoding and slice selection.

The RF transceiver 120 is connected with the RF coil assembly 128 to apply an RF pulse and/or a signal related to application of the RF pulse to the RF coil assembly 128. As illustrated in FIG. 1, the RF coil assembly 128 may include a whole-body coil which may serve as a transmit/receive coil. Additionally or optionally, the RF coil assembly 128 may include a local RF coil or coils which may be configured to transmit the RF pulse to and/or receive the MR signals from the object. For example, the RF transceiver 120 may include an RF transmitter 123 which transmits the RF pulse sequence to the whole-body coil or the local coil of the RF coil assembly 128, to apply RF pulses to the object, to perform the prescribed magnetic resonance pulse sequence. The MR signals from the object may be detected by the whole-body coil or the local coil of the RF coil assembly 128 and may be received by an RF receiver 125 of the RF transceiver 120, where they are amplified, demodulated, filtered, and digitized based on commands received from the pulse sequence controller 110. The RF transmitter 123 may generate a wide variety of RF pulses used in MRI pulse sequences. In response to the scan prescription and control of the pulse sequence controller 110, the RF transmitter 123 may generate RF pulses of desired frequency, phase, and pulse amplitude.

The RF receiver 125 may include one or more RF receiver channels. Each RF receiver channel may include an associated RF preamplifier that amplifies the MR signal received by the RF coil assembly 128, and a detector that detects and digitizes the in phase and quadrature components of the received MR signal. The magnitude of the received MR signal may, therefore, be determined at any sampled point by the square root of the sum of the squares of the in phase and quadrature components, i.e., I and Q channels:

$$M=\sqrt{I^2+Q^2}$$ Equation (1)

The phase of the received MR signal may be determined as:

$$\varphi = \tan^{-1}\left(\frac{Q}{I}\right)$$ Equation (2)

The pulse sequence controller 110 may optionally receive patient data from a physiological acquisition controller 130. For example, the physiological acquisition controller 130 may receive physiological information signals from different sensors connected to the object 119, such as electrocardiograph (ECG) signals and/or respiratory signals indicating a respiratory expansion from respiratory bellows or other respiratory monitoring device. The physiological information signals may be used by the pulse sequence controller 110 to synchronize, or gate, the execution of the scan with the object's heart beat and/or respiration.

The pulse sequence controller 110 may be connected to a scan room interface 132 that receives signals from various sensors associated with the condition of the object 119 and the magnet system. For example, the scan room interface 132 provides commands to a patient positioning system 134 to move the object 119 on the cradle 121 to desired positions during the scan.

The digitized MR signal samples generated by the RF transceiver 120 are received by the data buffer 112. The data buffer 112 operates in response to instructions received from the operator workstation 102 to receive the real-time magnetic resonance data and provide buffer storage, such that no data is lost by data overrun.

In the scans that require information derived from acquired magnetic resonance data to control the further performance of the scan, the data buffer 112 may be controlled to generate such information and convey it to the pulse sequence controller 110. For example, during prescans, magnetic resonance data may be acquired and used to calibrate the pulse sequence performed by the pulse sequence controller 110. As another example, navigator signals may be acquired and used to adjust the operating parameters of the RF transceiver 120 and/or the gradient controller 118, or to control the view order in which k-space is sampled. As another example, the data buffer 112 may process MR signals used to detect the arrival of a contrast agent, for example, in an MR angiography (MRA) scan. For example, the data buffer 112 acquires magnetic resonance data and processes it in real-time to generate information that is used to control the scan.

The data processor 114 receives magnetic resonance data from the data buffer 112 and processes it in accordance with instructions downloaded from the operator workstation 102. The data processor 114 may obtain image data sets having different MR parameter values to generate an MR parameter map. The MR parameter map may include at least one of a T1 map, a T2 map, etc. An image processor 152 may form the MR parameter map based on the obtained data set. For example, the image processor 152 may perform at least one of reconstructing two-dimensional (2D) or three-dimensional (3D) images by performing a Fourier transformation of raw k-space data, performing image reconstruction algorithms, such as iterative or backprojection reconstruction algorithms, applying filtering to the raw k-space data or to the reconstructed image data, generating functional magnetic resonance (fMR) images, calculating motion or flow images, and so on.

Although the curve fitter 150 and the image processor 152 are illustrated as components separate from the data processor 114 in FIG. 1, the curve fitter 150 and/or the image processor 152 may be incorporated within the data processor 114. Also, at least one of the curve fitter 150 and the image processor 152 may be omitted and the data processor 114 may perform functions at least one of the curve fitter 150 and the image processor 152, in accordance with exemplary embodiments.

Images reconstructed by the image processor 152 may be transferred to the operator workstation 102 and/or stored. Real-time images may be stored in a database memory cache (not shown in FIG. 1), from which the images may be output to operator display 112 or a display 136 that is located near the magnet assembly 124. Batch mode images or selected real time images may be stored in a host database on disc storage 138 or on a remote server (not shown). When the images have been reconstructed and transferred to storage, the image processor 152 may notify the operator workstation 102, i.e., a user. The operator workstation 102 may be used by an operator to archive the images, generate films, or send the images via a network to other facilities.

The MRI apparatus 100 may include one or more networked workstations 142. For example, a networked workstation 142 may include a display 144, one or more input devices 146, such as a keyboard and mouse, and a processor 148. The networked workstation 142 may be located within the same facility as the operator workstation 102, or in a different facility, for example, a different healthcare institution or a clinic.

The networked workstation 142 may gain remote access to the data processor 114, curve fitter 150, image processor 152, and/or data storage server 116 via the communication apparatus 117. In this manner, magnetic resonance data, reconstructed images, or other data may be exchanged with the networked workstations 142, such that the data or images may be remotely processed by a networked workstation 142. The data may be exchanged in any suitable format, such as in accordance with the transmission control protocol (TCP), the Internet protocol (IP), or other suitable protocols.

Figure 6:
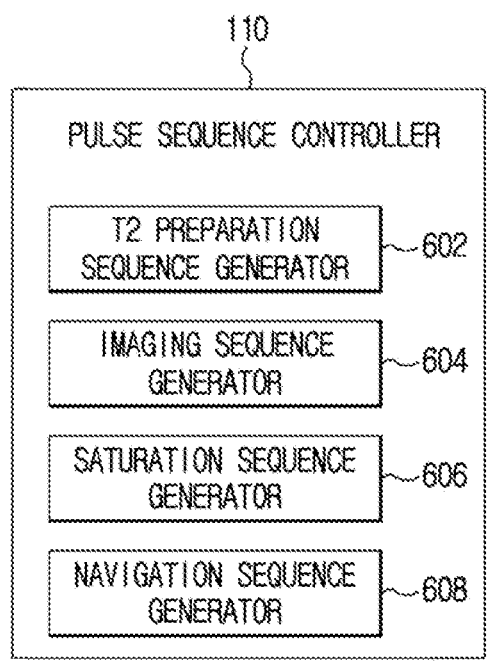
FIG. 6 illustrates a portion of an MRI apparatus, according to an exemplary embodiment.

Referring to FIG. 6, the pulse sequence controller 110 may include a $T_2$-preparation sequence generator 602 and an imaging sequence generator 604 to control an execution of a $T_2$ weighted pulse sequence.

Figure 2:
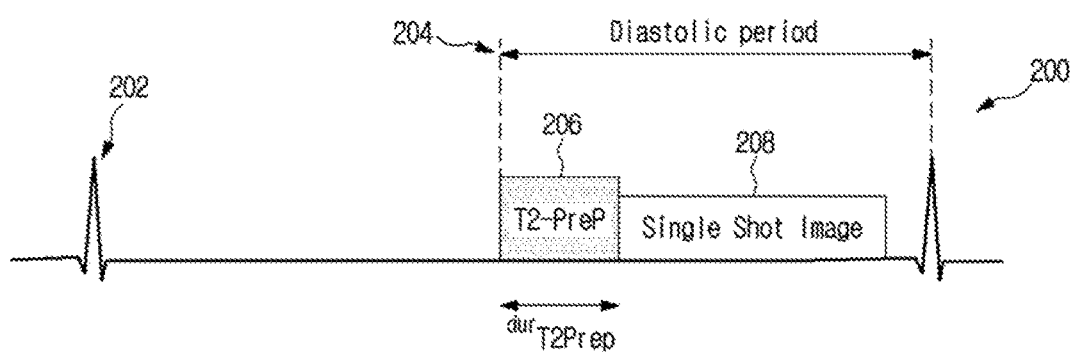
FIG. 2 is a diagram of a pulse sequence for acquiring $T_2$-weighted data, according to an exemplary embodiment.

Referring to FIG. 2, a $T_2$ weighted imaging process 200 is illustrated. The process 200 may be a gated acquisition, for example, using an ECG signal as a trigger 202 used to determine a period in the cardiac cycle, such as a diastolic period 204. The $T_2$-preparation sequence generator 602 may execute a $T_2$-preparation module 206 based on the trigger 202 after a time delay lapses, and, consequently, the imaging sequence generator 604 may execute an imaging sequence and a single image may be acquired, in a single-shot image acquisition 208.

Figure 3:
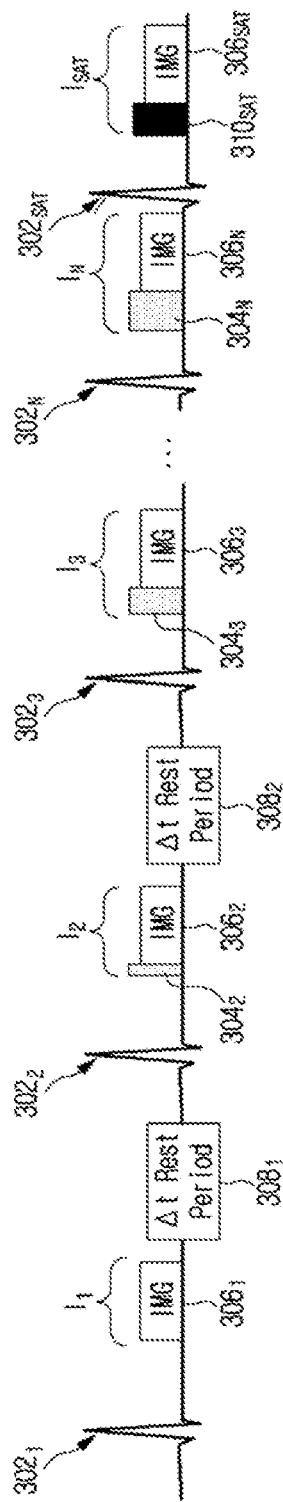
FIG. 3 is a diagram of a pulse sequence according to an exemplary embodiment.

Referring to FIG. 3, the $T_2$ weighted pulse sequence of FIG. 2 may be adapted in accordance with an exemplary embodiment to create a new pulse sequence 300, by the pulse sequence controller 110. As illustrated, N image acquisitions $I_1$, $I_2$, and $I_3$ through $I_N$ may be performed, which, for example, may be single-shot image acquisitions, to acquire multiple single-shot images using ECG signal as a trigger. As a non-limiting example, N may range from 3 to 9, to acquire a corresponding number of images.

Each of the image acquisitions is timed relative to a trigger signal $302_1$, $302_2$, and $302_3$ through $302_N$ and may be acquired with different $T_2$-preparation modules $304_2$ and $304_3$ through $304_N$, i.e., $T_2$-preparation pulse sequences with differently set parameters, for example, with differently set time echo lengths $TE_{T2P}$, executed by the $T_2$-preparation sequence generator 602. The sequence of RF pulses of the $T_2$-preparation module may include, for example, a 90° pulse, followed by one or more of 180° and/or −180° pulses. A −90° RF pulse may conclude the $T_2$-preparation module. However, this is not limiting. In an exemplary embodiment, no $T_2$-preparation module is used for the image acquisition $I_1$, i.e., $TE_{T2P}$ is equal to 0.

The $T_2$-preparation modules $304_2$ through $304_N$ may be designed to include pulses that allow for a dense number of sampling points on the $T_2$-decay curve. Also, by increasing N, for example to around 9, more images may be acquired to have more samples on the $T_2$-decay curve. Increasing the number of samples increases the accuracy of the $T_2$ maps.

As illustrated in FIG. 3, each trigger signal $302_2$ through $302_N$ is followed by each of the $T_2$-preparation modules $304_2$ through $304_N$ executed with a time delay after each trigger signal $302_2$ through $302_N$. The $T_2$-preparation modules $304_2$ through $304_N$ are followed by respective imaging modules $306_2$ through $306_N$ which include pulse sequences to acquire the MR image data of the object. Because in the image acquisition $I_1$ no $T_2$-preparation module is performed, the imaging module $306_1$ is executed after the trigger signal $302_1$, with a time delay. For example, the time delay may be adjustable with respect to the imaging modules $306_1$ through $306_N$, to ensure the MR signal readout at the same phase of a cardiac cycle. For example, the imaging modules may include imaging sequences executed by the imaging sequence generator 604.

Rest periods $308_1$ and $308_2$ with no RF pulses may follow all or some of the imaging modules, for example, the imaging modules $306_1$ and $306_2$. The rest periods $308_1$ and $308_2$ may last $\Delta t_{rest}$ seconds after an execution of the imaging module, to control any $T_1$ recovery effect on the next image acquisition. For example, $\Delta t_{rest}$ may be from 0 to 10 seconds and, as a non-limiting example, around 6 seconds.

At the end of the sequence 300, a saturation sequence generator 606 may execute a saturation (SAT) pulse $310_{SAT}$, with a time delay after a trigger signal $302_{SAT}$ to perform a single saturation image acquisition $I_{SAT}$. For example, the imaging sequence generator 604 may control an execution of the imaging module $306_{SAT}$ to acquire a saturation image data after an execution of a preceding SAT pulse $310_{SAT}$. For example, the time delay may be adjustable with respect to the imaging module $306_{SAT}$, to ensure the MR signal readout at the same phase of a cardiac cycle as in the acquisition of the imaging modules $306_1$ through $306_N$. The saturation image corresponding to the image acquisition $I_{SAT}$ is used for the new fitting model, as described in detail below. The image acquisition $I_{SAT}$ does not use a preceding rest period since the SAT pulse $310_{SAT}$ aims to destroy all magnetization along the z-axis. For example, the SAT pulse $310_{SAT}$ may include 90° RF pulses at relatively short repetition times, followed by a spoiling gradient, but this is not limiting.

Figure 4A:
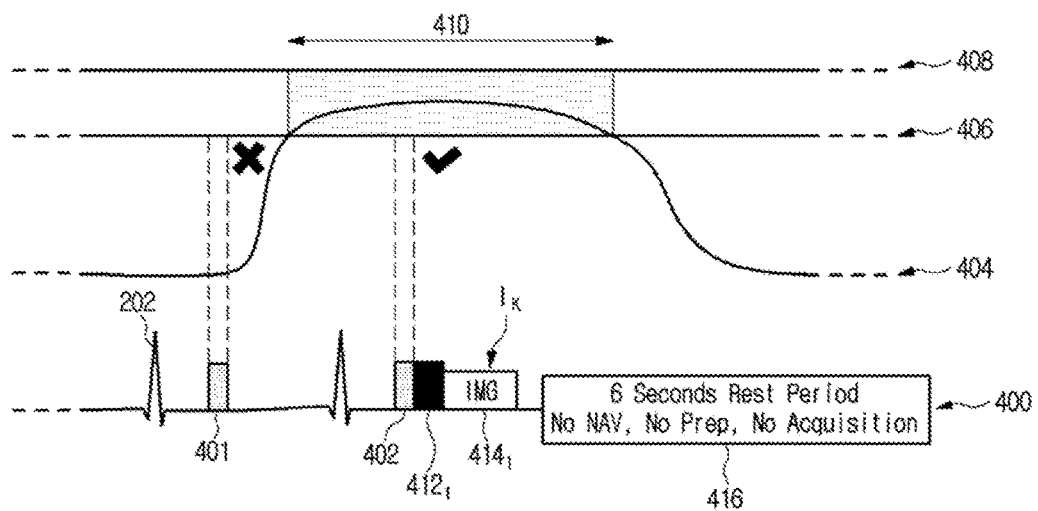
FIG. 4A is a diagram of a pulse sequence according to an exemplary embodiment.

Referring to FIG. 4A, a pulse sequence section 400 is illustrated. For example, the pulse sequence section 400 may be a section of the pulse sequence 300 described above with reference to FIG. 3 which may include a plurality of such pulse sequence sections. The pulse sequence section 400 may correspond to an image acquisition $I_k$ which represents one of the image acquisitions $I_1$ through $I_N$.

The pulse sequence section 400 may include a navigator pulse 402 preceding a $T_2$-preparation module $412_1$, according to an exemplary embodiment. For example, the data acquired using the navigator pulse 402 may be used to gate each of subsequent image acquisitions $I_1$ through $I_N$. For example, the data acquired using the navigator pulse 402 may be used to track breathing. In the illustrated example of tracking breathing, a position of the diaphragm of the object being imaged may be tracked over time, as illustrated by a positional graph 404. The positional information on the positional graph 404 may be compared to a set of positional thresholds 406, 408 that indicate a range 410 of accepted diaphragm positions.

As illustrated in FIG. 4A, the navigator pulse 402 is applied before the $T_2$-preparation module $412_1$ and before an associated imaging module $414_1$, which are timed to be within the range 410 of the accepted diaphragm positions. That is, if the position of the tracked physiological movement as determined by the image data acquired using the navigator pulse 402 is within the accepted range 410, then the $T_2$-preparation module $412_1$ is applied and the imaging module $414_1$ is performed thereafter.

After the image acquisition is completed, the sequence may include a pause, i.e., a rest period 416, for the time period $\Delta t_{rest}$, to allow for full $T_1$ recovery from the last acquisition. However, if the position of the navigator pulse 401 is outside of the range 410 of the accepted diaphragm positions, no $T_2$-preparation pulses or imaging pulses are applied and no recovery period is applied. Thus, the imaging time may be shortened. The magnetization remains undisturbed and the image data is acquired in the next RR interval by executing the navigation pulse and the image acquisition. The navigation pulses may be executed by a navigation sequence generator 608 and the navigation image data may be acquired and processed by the data processor 114.

Figure 4B:
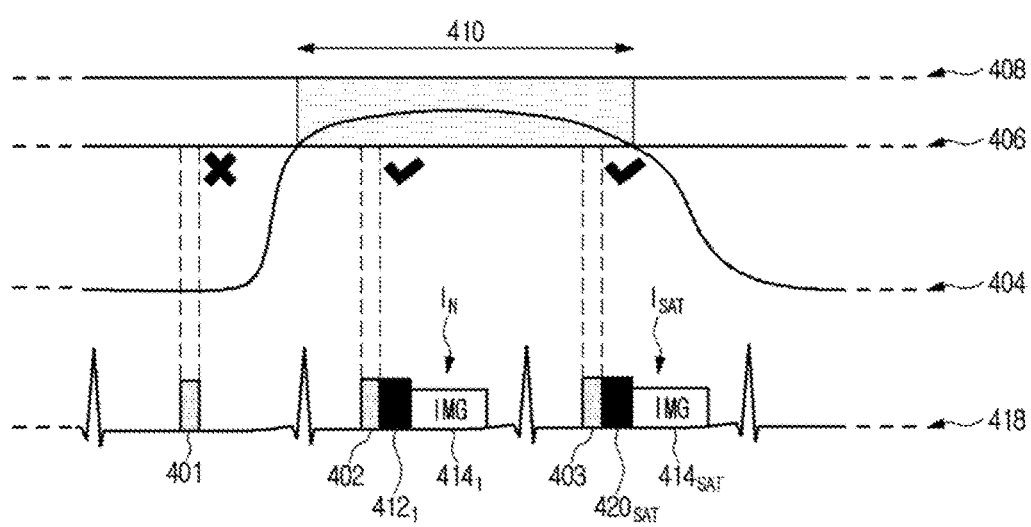
FIG. 4B is a diagram of a pulse sequence according to an exemplary embodiment.

Referring to FIG. 4B, a pulse sequence section 418 is illustrated. For example, the pulse sequence section 418 may be a section of the pulse sequence 300 described above with reference to FIG. 3. A portion of the pulse sequence section 418 may be substantially the same as the pulse sequence section 400 described above with reference to FIG. 4A. In addition, the pulse sequence section 418 includes a navigator pulse 403 which precedes a SAT pulse $420_{SAT}$.

Although the navigator image data acquired using the navigator pulse 403 indicates that the position of the tracked physiological movement is within the range 410, the $T_2$-preparation module is not applied and the imaging module $414_{SAT}$ is performed after application of SAT pulse $420_{SAT}$. Further, no rest period is applied after the last image acquisition $I_N$ which immediately precedes the saturation image acquisition $I_{SAT}$.

In FIG. 6, the $T_2$-preparation sequence generator 602, the imaging sequence generator 604, the saturation sequence generator 606, and the navigation sequence generator 608 are illustrated as being incorporated into the pulse sequence controller 110. However, the pulse sequence controller 110 may omit some of the illustrated components or may have a greater number of components. Further, one or more of the $T_2$-preparation sequence generator 602, the imaging sequence generator 604, the saturation sequence generator 606, and the navigation sequence generator 608 may be components separate from the pulse sequence controller 110.

Figure 7:
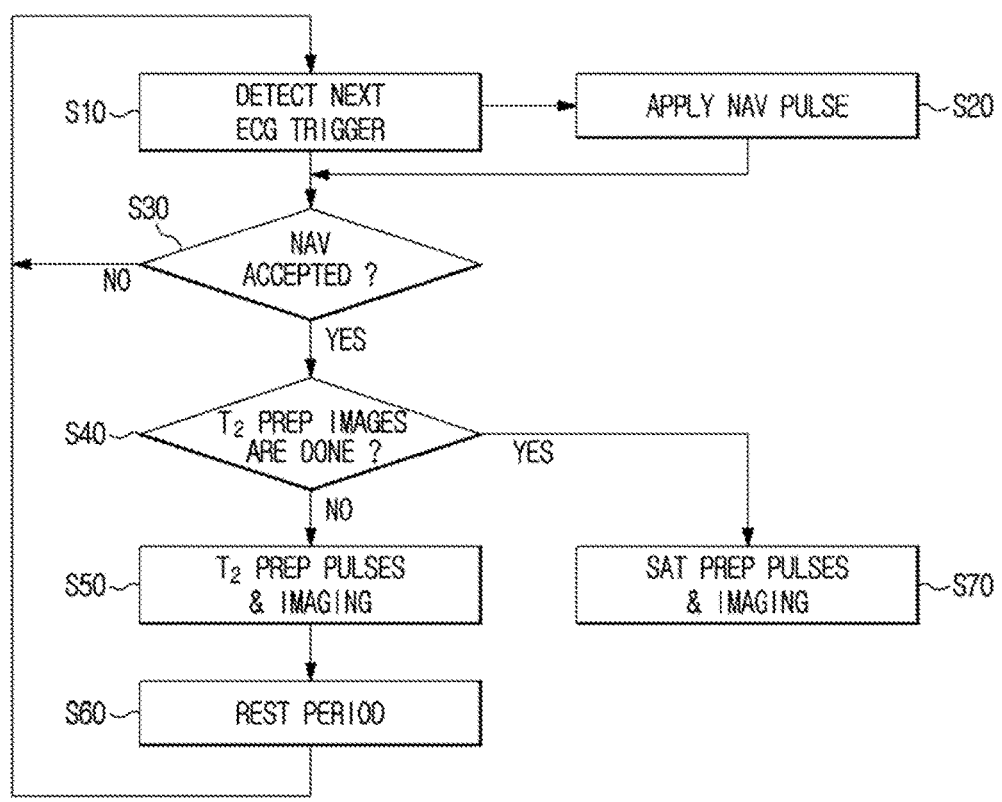
FIG. 7 is a flowchart of a method, according to an exemplary embodiment.

With reference to FIG. 7, in a navigator-gated acquisition, an ECG signal is detected in operation S10. The NAV pulse is applied in operation S20, to immediately precede the $T_2$ preparation module. In operation S30, it is determined whether the NAV signal is outside the gating window 410, for the acquisition of the kth image in the kth image acquisition Ik. If it is determined that the NAV signal is outside the gating window 410, no T2 preparation or imaging pulses are applied, and the acquisition of the kth image is performed in the next R-R interval. If it is determined that the NAV signal is within the gating window 410, it is determined whether all of the T2 preparation images are acquired (operation S40). If it is determined that not all of the T2 preparation images are acquired, the kth image with the desired T2 preparation time is acquired (operation S50), followed by a rest period for magnetization recovery (operation S60). If it is determined that all of the T2 preparation images are acquired, the SAT pulse is applied and a saturation-prepared (SAT) image is acquired in operation S70, which immediately follows the acquisition of a last T2-prepared image without a rest period.

The above-described respiratory tracking is only an example. The above-described systems and methods are applicable to cardiac applications and, as a non-limiting example, may track respiratory and/or cardiac cycles. In cardiac applications, the exemplary sequence may be used in multiple varieties. For example, when $\Delta t_{rest}$ is 6 seconds, and three images are acquired, the sequence may readily fit in one breath-hold scan, for example, for approximately 12 seconds of a breath-hold. This greatly helps to avoid any mis-registration between the images due to the breathing. If the patient has difficulties in holding breathe, the navigator gating may be enabled to get the same images in a free breathing mode. For a typical navigator gating efficiency of 50 percent, the sequence will be longer by only 2-4 seconds.

Also, the saturation image acquisition $I_{SAT}$ may be appended with only the cost of one more cardiac cycle (nearly 1 second) of the scan duration. In this case, the sequence still fits in one breath hold but the $T_2$-maps may be estimated using both the two-point fit model, as well as using a three-point fit model, as will be described below.

That is, the related art $T_2$ maps are generated by curve-fitting using the following two-parameter equation to corresponding pixels from each of, for example, three images:

$$S = A^{(-TE_{T2P}/T_2)}, \quad \text{Equation (3)}$$

where S is a signal intensity at a given location,

A is a base parameter that, for example, may include the equilibrium magnetization and local receiver coil gain, and $TE_{T_2P}$ is $T_2$ preparation echo time.

In accordance with an exemplary embodiment, the $T_2$ maps are generated by a curve fitter 150 using a three-parameter fit. When the images with different $T_2$-weights are acquired, several imaging pulses are applied until the center of k-space is acquired. These imaging pulses cause the magnetization to reach a steady state that is different than the equilibrium magnetization. The difference may be characterized using a three-parameter model in accordance with an exemplary embodiment that takes the form:

$$S(t) = Ae^{(-t/T_2)} + B \quad \text{Equation (4)},$$

where S is a signal intensity at a given location,

A is a base parameter that, for example, includes the equilibrium magnetization and local receiver coil gain, t is a $T_2$-preparation echo time, and B is a new model offset parameter due to a $T_1$ recovery effect during an image acquisition window introduced in accordance with an exemplary embodiment.

The curve fitter 150 processes the acquired $T_2$-weighted images, i.e., images weighted with different $T_2$ echo times, and the saturation-prepared image, to fit the $T_2$-decay curve by using the three-parameter model at each pixel, to yield a T2 map, which may be displayed as an image to a user. For example, a displayed image may be a color image.

In particular, the use of the SAT pulses in the exemplary sequences allows for an accurate fitting of a B offset, which captures the effect of the imaging pulses. Imaging after a SAT pulse simulates an acquisition where all magnetization history is erased, i.e., a complete $T_2$ decay, followed by the imaging pulses in the saturation imaging acquisition. That is, to estimate the offset value B, the above-described sequences and similar sequences include an imaging module executed after a saturation pulse SAT, which simulates acquisition at a very long $TE_{T2P}$, i.e., an equivalent of an image with $TE_{T2P}$ equal to infinity, to obtain a saturation-prepared image which captures the effect of the imaging pulses on the magnetization curve and improves the estimation of the offset parameter B.

Thus, the use of the above-described pulse sequences or similar sequences and the three-parameter model of Equation 4 creates a fitting construct that allows for accurate characterization of $T_2$ times, which is independent of a number of echos and the $T_2$ preparation echo time used, unlike the two-parameter fit of the related art.

Further, the two-parameter model may be inadequate for most single-shot acquisitions used in practice, as the signal regrows during imaging pulses. However, the above-described systems and methods of exemplary embodiments may overcome the shortcomings of the related art. For example, a number of sequences have been proposed for myocardial $T_2$ mapping, with reported healthy myocardium $T_2$ values ranging between 40-60 ms. These sequences sample the $T_2$ relaxation curve based on a variety of contrast mechanisms, echo types, k-space orderings and trajectories, and segmented/single-shot acquisitions. In all of these studies, however, a two-point model for $T_2$ decay, such as described above, is used to generate the $T_2$ data regardless of the details of the sequence. A study was done to compare the above-described two-point and three-point models for $T_2$ mapping for different k-space orderings using steady-state free precession (SSFP) and gradient recalled echo (GRE) imaging pulse sequences.

Suppose a $T_2$ preparation is performed such that the magnetization at the start of imaging is:

$$M(TE_{prep}) = A^{-TE_{T2P}/T_2} \quad \text{Equation (5)}$$

For convenience of description, the following will focus on a balanced SSFP (bSSFP) acquisition. If there are n RF pulses to the center of k-space, the signal intensity may be expressed by Equation (6):

$$S(n) = [\sin(\alpha/2)M(TE_{prep}) - M_{SS}]\lambda^n + M_{SS}$$

where $\alpha$ is a flip angle, $M_{SS}$ is steady-state magnetization, and $\lambda$ and $M_{SS}$ may be explicitly written in terms of exp $(-TR/T_1)$, exp $(-TR/T_2)$, and $\alpha$.

The Equation (6) may be re-arranged for S(n), as Equation (7):

$$S(n) = c(n)M(TE_{prep}) + d(n) \triangleq \alpha'(n)\exp(-TE_{prep}/T_2) + d(n)$$

where $\alpha'(n)$ and d(n) are constants depending on n which is the number of RF pulses to the center of k-space.

Since S(n) corresponding to the center of k-space has the highest influence in determining the contrast of the sampled points on the $T_2$ curve, for accurate $T_2$ estimation, a three-point fit, such as described above, is needed for linear k-space ordering, while a two-point fit or a three-point fit may be used for centric ordering.

Phantom imaging of $NiCl_2$ doped agarose vials with different concentrations was performed using a $T_2$ mapping sequence including a GRE with centric ordering, GRE with linear ordering, and a SSFP with linear ordering. For linear ordering there were 37 pulses to the center of k-space, and eight $TE_{prep}$ of $T_2$ preparation were used at 0, 25, 35, 45, 55, 65, 75, and 85 ms. Spin echo sequences were acquired to generate reference $T_2$ and $T_1$ values. For $T_2$ mapping, $T_2$ estimation was performed offline using MATLAB (v7.6, by MathWorks Inc., of Natick, Mass.). For each acquisition, both a two-point fit and a three-point fit were performed. An ROI analysis was performed on $T_2$ maps, where ROIs were drawn on each vial, and the mean value and standard deviation in the ROI was recorded for each acquisition.

The results of the $T_2$ estimation are shown in the table of FIG. 5, where $T_2$ values outside 10 percent of the reference value are indicated in italics. The $T_1$ values for the vials were 752, 1185, 1182, and 1180 ms, respectively, with the $T_1$ values for vials 2, 3, and 4 being similar to that of the healthy myocardium. When a linear k-space ordering is utilized, the two-point fit overestimates the $T_2$ values by 20 to 60 percent (range: 13.1 ms to 28.1 ms), as compared to the corresponding reference values. The overestimation is worse for shorter $T_1$ values, where the longitudinal magnetization recovers more rapidly during the 37 imaging pulses applied until the center of k-space is acquired, causing a larger shift in S(n).

The three-point fit leads to an accurate $T_2$ estimate, as does the centric ordering with a two-point fit.

Thus, parameter fitting with the two-point model for $T_2$ mapping overestimates the $T_2$ values when linear k-space ordering is utilized in the acquisition. On the other hand, the three-point fit of an exemplary embodiment may be used with centric or linear k-space ordering to generate accurate $T_2$ maps.

Although one or more exemplary embodiments are described above as using a cardiac gated acquisition and a navigator pulse to gate the heartbeat and/or breathing, the exemplary embodiments are not limited thereto. For example, the described-above is applicable in imaging of organs and tissues which do not require the cardiac gating and/or the breathing gating. For example, an ECG signal and/or breathing signal may be omitted from the described above sequencing and other physical, hardware, or software signal may be used as a trigger and/or for gating.

Exemplary embodiments may be implemented by software or hardware components such as a field-programmable gate array (FPGA) or an application-specific integrated circuit (ASIC). The hardware component may include a storage medium capable of addressing, or may be configured to be executed by one or more processors. Software component may include object-oriented software components, class components, and task components, and processes, functions, attributes, procedures, subroutines, segments of a program code, drivers, firmware, a micro code, a circuit, data, a database, data structures, tables, arrays, and variables. Functions provided by different components may be combined into a smaller number of components or may be further separated into additional components.

The foregoing exemplary embodiments and advantages are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

The invention claimed is:

1. A magnetic resonance imaging (MRI) apparatus comprising:
   a pulse sequence controller configured to generate a pulse sequence and apply the generated pulse sequence to a gradient coil assembly and an RF coil assembly, the generated pulse sequence including:
   image acquisition modules, each of the image acquisition modules comprising a $T_2$-preparation module including $T_2$-preparation pulses and an imaging module including imaging pulses, for acquiring a first set of $T_2$-weighted imaging data from an object disposed in an imaging region, and
   a saturation image acquisition module comprising a saturation pulse sequence and a saturation imaging module including imaging pulses for acquiring, from the object, a second set of $T_2$-weighted imaging data with a substantially complete $T_2$ decay;
   a data processor configured to acquire the first set of $T_2$-weighted imaging data, as a result of performing the image acquisition modules, and the second set of $T_2$-weighted imaging data, as a result of performing the saturation image acquisition module after the first set of $T_2$-weighted imaging data is acquired:
   a curve fitter configured to apply the first set of $T_2$-weighted imaging data and the second set of $T_2$-weighted imaging data to a three-parameter model for a $T_2$ decay that models an image signal relative to a base intensity parameter, a tissue $T_2$ value, and an offset parameter to determine a $T_2$ value at a plurality of locations; and
   an image processor configured to generate a $T_2$ map of the object based on the $T_2$ value determined at the plurality of locations,
   wherein the offset parameter is a parameter which compensates for a $T_1$ recovery effect during an image acquisition, and is calculated based on the second set of $T_2$-weighted imaging data.

2. The MRI apparatus of claim 1, wherein the three-parameter model includes a form:

$$S(t)=Ae^{(-t/T2)}+B,$$

where S is an image signal intensity at a given location in the plurality of locations,
A is the base intensity parameter,
t is a $T_2$-preparation echo time, and
B is the offset parameter.

3. The MRI apparatus of claim 1, wherein the pulse sequence controller comprises a saturation sequence generator configured to execute the saturation pulse sequence, and
   the data processor is configured to acquire the second set of $T_2$-weighted imaging data to simulate an acquisition where the substantially complete T2 decay has occurred.

4. The MRI apparatus of claim 1, wherein the pulse sequence controller is configured to execute a plurality of iterations of the image acquisition modules.

5. The MRI apparatus of claim 4, wherein the pulse sequence controller is configured to perform a rest period between each two iterations of the plurality of iterations of the image acquisition modules.

6. The MRI apparatus of claim 5, wherein the rest period is configured to control the $T_1$ recovery effect on subsequent imaging modules.

7. The MRI apparatus of claim 1, wherein the pulse sequence controller further comprises a navigation sequence generator configured to execute a navigation module to acquire navigation image data, and gate an execution of the image acquisition modules and the saturation image acquisition module based on the navigation image data.

8. The MRI apparatus of claim 1, wherein the pulse sequence controller is configured to control gating of an acquisition of the first set of $T_2$-weighted imaging data and the second set of $T_2$-weighted imaging data based on a physiological parameter of the object.

9. The MRI apparatus of claim 8, wherein the physiological parameter includes at least one among a respiratory cycle parameter and a cardiac cycle parameter.

10. A magnetic resonance imaging (MRI) method comprising:
   (a) applying a $T_2$-preparation module including $T_2$-preparation pulses to a region of interest (ROI) of an object;
   (b) subsequent to an application of the $T_2$-preparation module, applying an associated imaging module including imaging pulses, to acquire a first $T_2$-weighted data from the ROI;
   (c) repeating applications of the $T_2$-preparation module followed by the associated imaging module a plurality of times to acquire a number of sampling points on a $T_2$-decay curve;
   (d) applying a saturation pulse sequence to the ROI after a last iteration of the steps (a), (b), and (c);
   (e) applying a saturation imaging module including imaging pulses following the saturation pulse sequence, to acquire a second $T_2$-weighted data from the ROI with a substantially complete $T_2$ decay; and
   (f) generating a $T_2$ map of the ROI based on the first $T_2$-weighted data acquired as a result of iterations of the steps (a) and (b) and on the second $T_2$-weighted data acquired in the step (e) using a $T_2$-relaxation model,
   wherein the $T_2$-relaxation model is a three-parameter model for a $T_2$ decay that models an image signal relative to a base intensity parameter, a tissue $T_2$ value, and an offset parameter to determine a $T_2$ value at a plurality of locations, and
   wherein the offset parameter is a parameter which compensates for a $T_1$ recovery effect during an image acquisition, and is calculated based on the second $T_2$-weighted data.

11. The MRI method of claim 10, wherein the associated imaging module is a single-shot imaging module which acquires a single image of the ROI.

12. The MRI method of claim 10, wherein the $T_2$-relaxation model includes a form:

$$S(t)=Ae^{(-t/T_2)}+B,$$

where S is a signal intensity at a given location in the ROI,
A is the base intensity parameter,
t is a $T_2$-preparation echo time, and
B is the offset parameter.

13. The MRI method of claim 10, wherein the step (c) includes:
   performing a rest period between iterations, after the step (b) and before a subsequent step (a).

14. The MRI method of claim 13, wherein the rest period is configured to control the $T_1$ recovery effect on the first $T_2$-weighted data acquired during subsequent executions of the step (b).

15. The MRI method of claim 13, wherein the rest period is omitted preceding an application of the saturation pulse sequence, after the last iteration is performed.

16. The MRI method of claim 10, further comprising:
   applying a navigation pulse sequence to acquire navigation image data, and
   gating the step (a) based on the acquired navigation image data.

17. The MRI method of claim 10, further comprising:
   gating the steps (a), (c), and (d) based on a physiological parameter of the object.

18. The MRI method of claim 17, wherein the physiological parameter includes at least one among a respiratory cycle parameter and a cardiac cycle parameter.

19. A non-transitory computer-readable storage medium having recorded thereon computer instructions that, when executed by a processor, cause the processor to execute a method comprising:
   (a) applying a $T_2$-preparation module including $T_2$-preparation pulses to a region of interest (ROI) of an object;
   (b) subsequent to an application of the $T_2$-preparation module, applying an associated imaging module including imaging pulses, to acquire a first $T_2$-weighted data from the ROI;
   (c) repeating applications of the $T_2$-preparation module followed by the associated imaging module a plurality of times to acquire a number of sampling points on a $T_2$-decay curve;
   (d) applying a saturation pulse sequence to the ROI after a last iteration of the steps (a), (b), and (c);
   (e) applying a saturation imaging module including imaging pulses following the saturation pulse sequence, to acquire a second $T_2$-weighted data from the ROI with a substantially complete $T_2$ decay; and
   (f) generating a $T_2$ map of the ROI based on the first $T_2$-weighted data acquired as a result of iterations of the steps (a) and (b) and on the second $T_2$-weighted data acquired in the step (e) using a $T_2$-relaxation model,
   wherein the $T_2$-relaxation model is
   a three-parameter model for a $T_2$ decay that models an image signal relative to a base intensity parameter, a tissue $T_2$ value, and an offset parameter to determine a $T_2$ value at a plurality of locations, and
   wherein the offset parameter is a parameter which compensates for a $T_1$ recovery effect during an image acquisition, and is calculated based on the second $T_2$-weighted data.

20. The non-transitory computer-readable storage medium of claim 19, wherein the three-parameter model has a form:

$$S(t)=Ae^{(-t/T_2)}+B,$$

where S is an image signal intensity at a given location in the plurality of locations,
A is the base intensity parameter,
t is a $T_2$-preparation echo time, and
B is the offset parameter.

21. The MRI apparatus of claim 1, wherein the pulse sequence controller is configured to execute a plurality of iterations of the image acquisition modules, while performing a rest period between each two iterations of the plurality of iterations, wherein the rest period is omitted preceding an application of the saturation pulse sequence, after a last iteration among the plurality of iterations is performed.

* * * * *